United States Patent
Vromans et al.

(10) Patent No.: US 8,766,738 B2
(45) Date of Patent: Jul. 1, 2014

(54) DECOMPOSER AND AMPLIFIER

(75) Inventors: Jan S. Vromans, Maastricht (NL); Manel Collados, Larkfield (GB)

(73) Assignee: NXP, B.V., Eindhoven (NL)

( * ) Notice: Subject to any disclaimer, the term of this patent is extended or adjusted under 35 U.S.C. 154(b) by 187 days.

(21) Appl. No.: 13/129,573

(22) PCT Filed: Nov. 2, 2009

(86) PCT No.: PCT/IB2009/054846
§ 371 (c)(1),
(2), (4) Date: May 16, 2011

(87) PCT Pub. No.: WO2010/058310
PCT Pub. Date: May 27, 2010

(65) Prior Publication Data
US 2011/0285471 A1  Nov. 24, 2011

(30) Foreign Application Priority Data
Nov. 18, 2008  (EP) .................................. 08105813

(51) Int. Cl.
*H04L 27/20* (2006.01)
(52) U.S. Cl.
USPC ........... 332/103; 332/120; 332/125; 332/145; 332/176
(58) Field of Classification Search
USPC .......................... 332/103, 120, 125, 145, 176
See application file for complete search history.

(56) References Cited

U.S. PATENT DOCUMENTS

| | | | | |
|---|---|---|---|---|
| 5,495,251 A | * | 2/1996 | Gilling et al. | 342/70 |
| 6,311,046 B1 | * | 10/2001 | Dent | 455/91 |
| 7,570,711 B1 | * | 8/2009 | Chavez et al. | 375/298 |
| 7,898,352 B2 | | 3/2011 | Vromans et al. | |
| 8,068,540 B2 | | 11/2011 | De Jong et al. | |
| 8,457,243 B2 | | 6/2013 | Vromans | |
| 8,509,300 B2 | | 8/2013 | Vromans | |

(Continued)

FOREIGN PATENT DOCUMENTS

JP  2005-079855 A  3/2005
JP  2007-150905 A  6/2007

(Continued)

OTHER PUBLICATIONS

Hegazi, G. et al. "Improved LINC Power Transmission Using a Quadrature Outphasing Technique", IEEE MTT-S Digest, pp. 1923-1926 (Jun. 2005).

(Continued)

*Primary Examiner* — Arnold Kinkead
*Assistant Examiner* — Richard Tan

(57) ABSTRACT

A quadrature out-phasing system comprising: a first baseband signal modifier (6) arranged to receive a first baseband signal component (2) and output a first constant envelope RF carrier (12) and a second constant envelope RF carrier (14); and a second baseband signal modifier (8) arranged to receive a second baseband signal component (4) and output a third constant envelope RF carrier (16) and a fourth constant envelope RF carrier (18). The system may further comprise: a first signal combiner (500) arranged to combine the first constant envelope RF carrier (12) and the second constant envelope RF carrier (14), and arranged to output a first RF PWM signal (94); and a second signal combiner (502) arranged to combine the third constant envelope RF carrier (16) and the fourth constant envelope RF carrier (18), and arranged to output a second RF PWM signal (96).

12 Claims, 6 Drawing Sheets

(56) References Cited

U.S. PATENT DOCUMENTS

| | | |
|---|---|---|
| 8,509,346 B2 | 8/2013 | Vromans |
| 8,526,536 B2 | 9/2013 | Vromans et al. |
| 2004/0204034 A1* | 10/2004 | Hanrahan ................ 455/552.1 |

FOREIGN PATENT DOCUMENTS

| | | |
|---|---|---|
| WO | 01/99439 A2 | 12/2001 |
| WO | 2007/029119 A2 | 3/2007 |
| WO | 2007/060562 A1 | 5/2007 |

OTHER PUBLICATIONS

Hegazi, G. et al. "Linear Widerband VHF/UHF Quad LINC Transmitter System", IEEE Military Communications Conf. (Milcom), 6 pgs., (Oct. 2007).

International Search Report and Written Opinion for Int'l. Patent Appln. No. Pct/Ib2009/054846 (May 10, 2010).

* cited by examiner

DECOMPOSER AND AMPLIFIER

The present invention relates to signal decomposers and amplifiers.

Several ways of controlling a power amplifier (PA) are known. A first known class of polar-modulation solutions are those where the AM-component is added via modulation of the supply voltage of the RF Power Amplifier. In order to be power efficient this supply-voltage modulation is done via an efficient switching DC-DC converter.

A second known class of polar-modulation solutions are those where the input of a switching PA is driven with a two-level PWM (Pulse Width Modulation) signal which is generated by comparing the AM- and PM-modulated carrier signal with a triangular (or saw-tooth) signal which fundamental frequency is at least twice the carrier frequency.

A third known class of polar-modulation solutions are those where the input of the switching PA is driven by a two-level pulse-density signal which is generated by a band-pass sigma-delta.

A fourth known class of modulations are those where the transmitted signal is generated with two out-phasing carriers (LING architectures). These architectures can also be used for switched PA and the efficiency can be approved with the Chireix compensation.

A disadvantage of all the architectures above is the large increase in bandwidth of the baseband signals. Large increases in bandwidth of the baseband signals can be as a result of the decomposition of the complex baseband in, for example, Polar, LING or bandpass PWM-PPM architectures. Also, for LING and bandpass PWM-PPM architectures the bandwidth of the RF constant envelope signals will increase which results in higher matching requirements for the RF branches. Higher matching requirements are not only needed to construct the original signal but also to fulfil the out of band spectrum mask.

Bandwidth enlargement will become even more important in the future because of the tendency of the increase of bandwidth of the baseband signals (or more channels) and the need of pre-distortion to compensate for the non-linearity in the transmitter chain.

The present inventors have realised it would be desirable to provide bandwidth reduction in baseband and RF auxiliary carriers.

In a first aspect, the present invention provides a quadrature out-phasing system comprising a first baseband signal modifier arranged to receive a first baseband signal component and output a first constant envelope RF carrier and a second constant envelope RF carrier, and a second baseband signal modifier arranged to receive a second baseband signal component and output a third constant envelope RF carrier and a fourth constant envelope RF carrier.

The quadrature out-phasing system may further comprise a local oscillator connected to the first baseband signal modifier and the second baseband signal modifier.

The first baseband signal modifier may be arranged to decompose the first baseband signal component into a first decomposed baseband signal and a second decomposed baseband signal, and the second baseband signal modifier may be arranged to decompose the second baseband signal component into a third decomposed baseband signal and a fourth decomposed baseband signal.

The first baseband signal modifier may be arranged to up convert to RF frequency and then combine the first decomposed baseband signal and the second decomposed baseband signal to form the first constant envelope RF carrier and the second constant envelope RF carrier, and the second baseband signal modifier may be arranged to up convert to RF frequency and then combine the third decomposed baseband signal and the fourth decomposed baseband signal to form the third constant envelope RF carrier and the fourth constant envelope RF carrier.

The first constant envelope RF carrier, the second constant envelope RF carrier, the third constant envelope RF carrier and the fourth constant envelope RF carrier may be determined using the following formulae:

$$I_{1\_RF} = Re(\bar{I}_{1\_RF}) = +A_{mi}\cos(\omega_c t + \theta_{Mi})$$

$$I_{2\_RF} = Re(\bar{I}_{2\_RF}) = +A_{mi}\cos(\omega_c t - \theta_{Mi})$$

$$Q_{1\_RF} = Re(\overline{Q_{1\_RF}}) = -A_{mq}\sin(\omega_c t + \theta_{Mq})$$

$$Q_{2\_RF} = Re(\overline{Q_{2\_RF}}) = -A_{mq}\sin(\omega_c t - \theta_{Mq})$$

where:
$I_{1\_RF}$ is the first constant envelope RF carrier;
$I_{2\_RF}$ is the second constant envelope RF carrier;
$Q_{1\_RF}$ is the third constant envelope RF carrier;
$Q_{2\_RF}$ is the fourth constant envelope RF carrier;
$A_{mi}$ is the amplitude of the complex constant envelope signal $I_1$ (or $I_2$);
$A_{mq}$ is the amplitude of the complex constant envelope signal $Q_1$ (or $Q_2$);
$\theta_{Mi}$ is the phase of the complex constant envelope signal $I_2$ derived from the original I component of the complex baseband signal;
$\theta_{Mq}$ is the phase of the complex constant envelope signal $Q_1$ derived from the original Q component of the complex baseband signal; and
$\omega_c$ is the frequency of the RF carrier signal.

The first decomposed baseband signal, the second decomposed baseband signal, the third decomposed baseband signal and the fourth decomposed baseband signal may be determined using the following formulae:

$$I_{1i} = \frac{I(t)}{2} = A_{mi}\cos(\theta_{Mi})$$

$$I_{1q} = A_{mi}\sqrt{1 - \frac{I(t)^2}{4A_{mi}^2}} = A_{mi}\sin(\theta_{Mi})$$

$$Q_{1i} = A_{mq}\sqrt{1 - \frac{Q(t)^2}{4A_{mq}^2}} = A_{mq}\sin(\theta_{Mq})$$

$$Q_{1q} = \frac{Q(t)}{2} = A_{mq}\cos(\theta_{Mq})$$

where:
$I_{1\_RF}$ is the first constant envelope RF carrier;
$I_{2\_RF}$ is the second constant envelope RF carrier;
$Q_{1\_RF}$ is the third constant envelope RF carrier;
$Q_{2\_RF}$ is the fourth constant envelope RF carrier;
$A_{mi}$ is the amplitude of the complex constant envelope signal $I_1$ (or $I_2$);
$A_{mq}$ is the amplitude of the complex constant envelope signal $Q_1$ (or $Q_2$);
$\theta_{Mi}$ is the phase of the complex constant envelope signal $I_2$ derived from the original I component of the complex baseband signal; and
$\theta_{Mq}$ is the phase of the complex constant envelope signal $Q_1$ derived from the original Q component of the complex baseband signal.

The quadrature out-phasing system may further comprise a first signal combiner arranged to combine the first constant envelope RF carrier and the second constant envelope RF carrier, and arranged to output a first RF PWM signal, and a second signal combiner arranged to combine the third constant envelope RF carrier and the fourth constant envelope RF carrier, and arranged to output a second RF PWM signal.

The first signal combiner may comprise a first limiter arranged to receive the first constant envelope RF carrier signal and output a limited first constant envelope RF carrier, a second limiter arranged to receive the second constant envelope RF carrier signal and output a limited second constant envelope RF carrier, and a first AND gate arranged to receive the limited first constant envelope RF carrier signal and the limited second constant envelope RF carrier signal, and to output the first RF PWM signal. The second signal combiner may comprise a third limiter arranged to receive the third constant envelope RF carrier signal and output a limited third constant envelope RF carrier, a fourth limiter arranged to receive the fourth constant envelope RF carrier signal and output a limited fourth constant envelope RF carrier, and a second AND gate arranged to receive the limited third constant envelope RF carrier signal and the limited fourth constant envelope RF carrier signal and to output the second RF PWM signal.

The quadrature out-phasing system may further comprise a first signal adder arranged to combine the first constant envelope RF carrier and the second constant envelope RF carrier, and arranged to output a first recombined AM modulated RF carrier, and a second signal adder arranged to combine the third constant envelope RF carrier and the fourth constant envelope RF carrier, and arranged to output a second recombined AM modulated RF carrier.

The quadrature out phasing system may further comprise a third signal adder arranged to combine the first recombined AM modulated RF carrier and the second recombined AM modulated RF carrier, and arranged to output a transmitted RF carrier baseband signal.

In a further aspect, the present invention provides a method of generating a first constant envelope RF carrier, a second constant envelope RF carrier, a third constant envelope RF carrier and a fourth constant envelope RF carrier, the method comprising the steps of receiving a first baseband signal component and modifying the first baseband signal component to form a first constant envelope RF carrier and a second constant envelope RF carrier, and receiving a second baseband signal component and modifying the second baseband signal component to form a third constant envelope RF carrier and a fourth constant envelope RF carrier.

The method may further comprise the steps of decomposing the first baseband signal component into a first decomposed baseband signal and a second decomposed baseband signal, and decomposing the second baseband signal component into a third decomposed baseband signal and a fourth decomposed baseband signal.

The method may further comprise the steps of up converting to RF frequency and then combining the first decomposed baseband signal and the second decomposed baseband signal to form the first constant envelope RF carrier and the second constant envelope RF carrier, and up converting to RF frequency and then combining the third decomposed baseband signal and the fourth decomposed baseband signal to form the third constant envelope RF carrier and the fourth constant envelope RF carrier.

The first constant envelope RF carrier, the second constant envelope RF carrier, the third constant envelope RF carrier and the fourth constant envelope RF carrier, may be determined using the following formulae:

$$I_{1\_RF} = Re(\tilde{I}_{1\_RF}) = +A_{mi}\cos(\omega_c t + \theta_{Mi})$$

$$I_{2\_RF} = Re(\tilde{I}_{2\_RF}) = +A_{mi}\cos(\omega_c t + \theta_{Mi})$$

$$Q_{1\_RF} = Re(\overline{Q_{1\_RF}}) = -A_{mq}\sin(\omega_c t + \theta_{Mq})$$

$$Q_{2\_RF} = Re(\overline{Q_{2\_RF}}) = -A_{mq}\sin(\omega_c t + \theta_{Mq})$$

Where:
$I_{1\_RF}$ is the first constant envelope RF carrier;
$I_{2\_RF}$ is the second constant envelope RF carrier;
$Q_{1\_RF}$ is the third constant envelope RF carrier;
$Q_{2\_RF}$ is the fourth constant envelope RF carrier;
$A_{mi}$ is the amplitude of the complex constant envelope signal (or $I_2$);
$A_{mq}$ is the amplitude of the complex constant envelope signal $Q_1$ (or $Q_2$);
$\theta_{Mi}$ is the phase of the complex constant envelope signal $I_2$ derived from the original I component of the complex baseband signal;
$\theta_{Mq}$ is the phase of the complex constant envelope signal $Q_1$ derived from the original Q component of the complex baseband signal; and
$\omega_c$ is the frequency of the RF carrier signal.

The first decomposed baseband signal, the second decomposed baseband signal, the third decomposed baseband signal and the fourth decomposed baseband signal, may be determined using the following formulae:

$$I_{1i} = \frac{I(t)}{2} = A_{mi}\cos(\theta_{Mi})$$

$$I_{1q} = A_{mi}\sqrt{1 - \frac{I(t)^2}{4A_{mi}^2}} = A_{mi}\sin(\theta_{Mi})$$

$$Q_{1i} = A_{mq}\sqrt{1 - \frac{Q(t)^2}{4A_{mq}^2}} = A_{mq}\sin(\theta_{Mq})$$

$$Q_{1q} = \frac{Q(t)}{2} = A_{mq}\cos(\theta_{Mq})$$

Where:
$I_{1i}$, is the first decomposed baseband signal;
$I_{1q}$ is the second decomposed baseband signal;
$Q_{1i}$ is the third decomposed baseband signal;
$Q_{1q}$ is the fourth decomposed baseband signal;
I(t) is the first baseband signal component;
Q(t) is the second baseband signal component;
$A_{mi}$ is the amplitude of the complex constant envelope signal (or $I_2$);
$A_{mq}$ is the amplitude of the complex constant envelope signal $Q_1$ (or $Q_2$);
$\theta_{Mi}$ is the phase of the complex constant envelope signal $I_2$ derived from the original I component of the complex baseband signal; and
$\theta_{Mq}$ is the phase of the complex constant envelope signal $Q_1$ derived from the original Q component of the complex baseband signal.

Embodiments of the present invention will now be described, by way of example, with reference to the accompanying drawings, in which.

Figure 1:
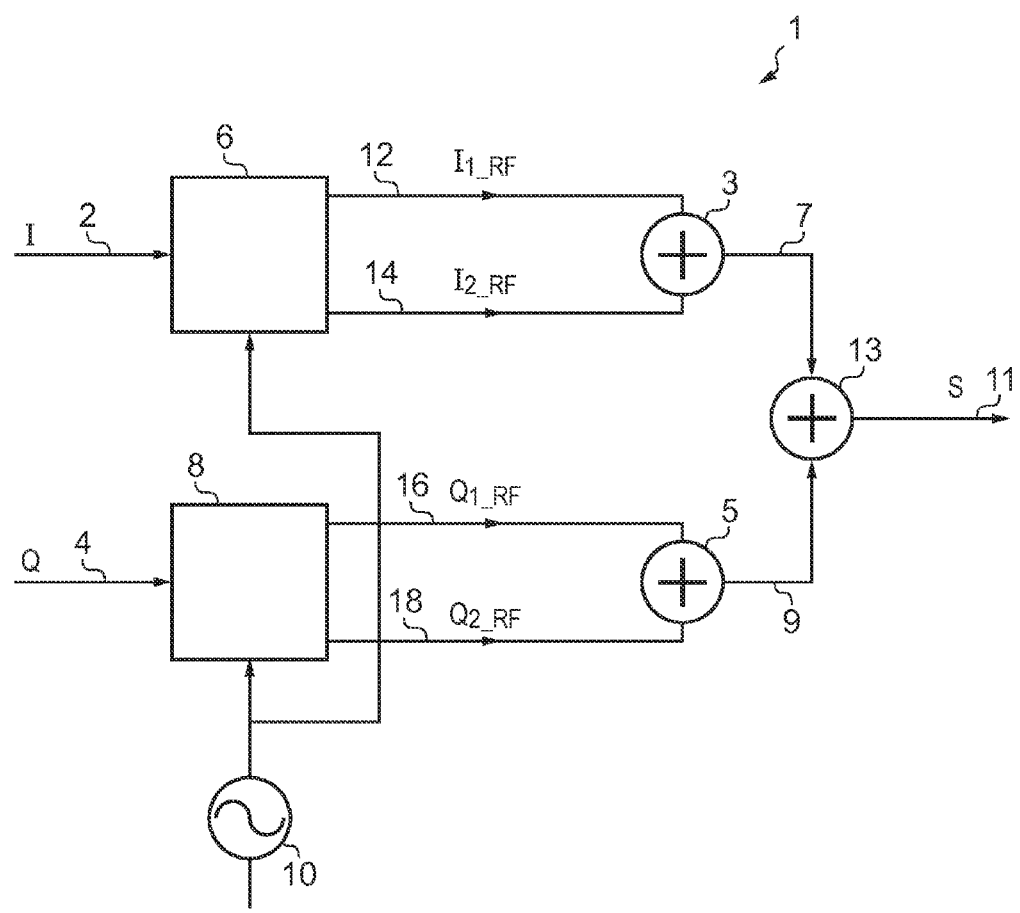
FIG. 1 is a schematic illustration of a quadrature out-phasing system.

FIG. 1 is a schematic illustration (not to scale) of a quadrature out-phasing system 1, according to a first embodiment. The quadrature out-phasing system 1 comprises a first baseband component modifier 6, a second baseband component modifier 8, a local oscillator 10, a first signal adder 3, a second signal adder 5, and a third signal adder 13.

The local oscillator 10 is connected to the first baseband component modifier 6 and the second baseband component modifier 8.

A first baseband component I 2 is inputted into the first baseband component modifier 6.

The first baseband component modifier 6 decomposes the first baseband component I 2 into a first constant envelope RF carrier $I_{1\_RF}$ 12 and a second constant envelope RF carrier $I_{2\_RF}$ 14.

The first baseband component modifier 6 outputs the first constant envelope RF carrier $I_{1\_RF}$ 12 and the second constant envelope RF carrier $I_{2\_RF}$ 14.

The first constant envelope RF carrier signal $I_{1\_RF}$ 12 and the second constant envelope RF carrier signal $I_{2\_RF}$ 14 are inputted into the first signal adder 3.

The first signal adder 3 adds the first constant envelope RF carrier $I_{1\_RF}$ 12 and the second constant envelope RF carrier $I_{2\_RF}$ 14 to form a first recombined AM modulated RF carrier 7. The first signal adder 3 outputs the first recombined AM modulated RF carrier 7.

The first recombined AM modulated RF carrier 7 is inputted to the third signal adder 13.

A second baseband component Q 4 is inputted into the second baseband component modifier 8.

The second baseband component modifier 8 decomposes the second baseband component Q 4 into a third constant envelope RF carrier $Q_{1\_RF}$ 16 and a fourth constant envelope RF carrier $Q_{2\_RF}$ 18. The second baseband component modifier 8 outputs the third constant envelope RF carrier $Q_{1\_RF}$ 16 and the fourth constant envelope RF carrier $Q_{2\_RF}$ 18.

The third constant envelope RF carrier $Q_{1\_RF}$ 16 and the fourth constant envelope RF carrier $Q_{2\_RF}$ 18 are inputted into the second signal adder 5.

The second signal adder 5 adds the third constant envelope RF carrier $Q_{1\_RF}$ 16 and the fourth constant envelope RF carrier $Q_{2\_RF}$ 18 to form a second recombined AM modulated RF carrier 9. The second signal adder 5 outputs the second recombined AM modulated RF carrier 9.

The second recombined AM modulated RF carrier 9 is inputted to the third signal adder 13.

The third signal adder 13 combines the first recombined AM modulated RF carrier signal 7 and the second recombined AM modulated RF carrier signal 9 to form a transmitted RF carrier (baseband) signal s 11.

Figure 2:
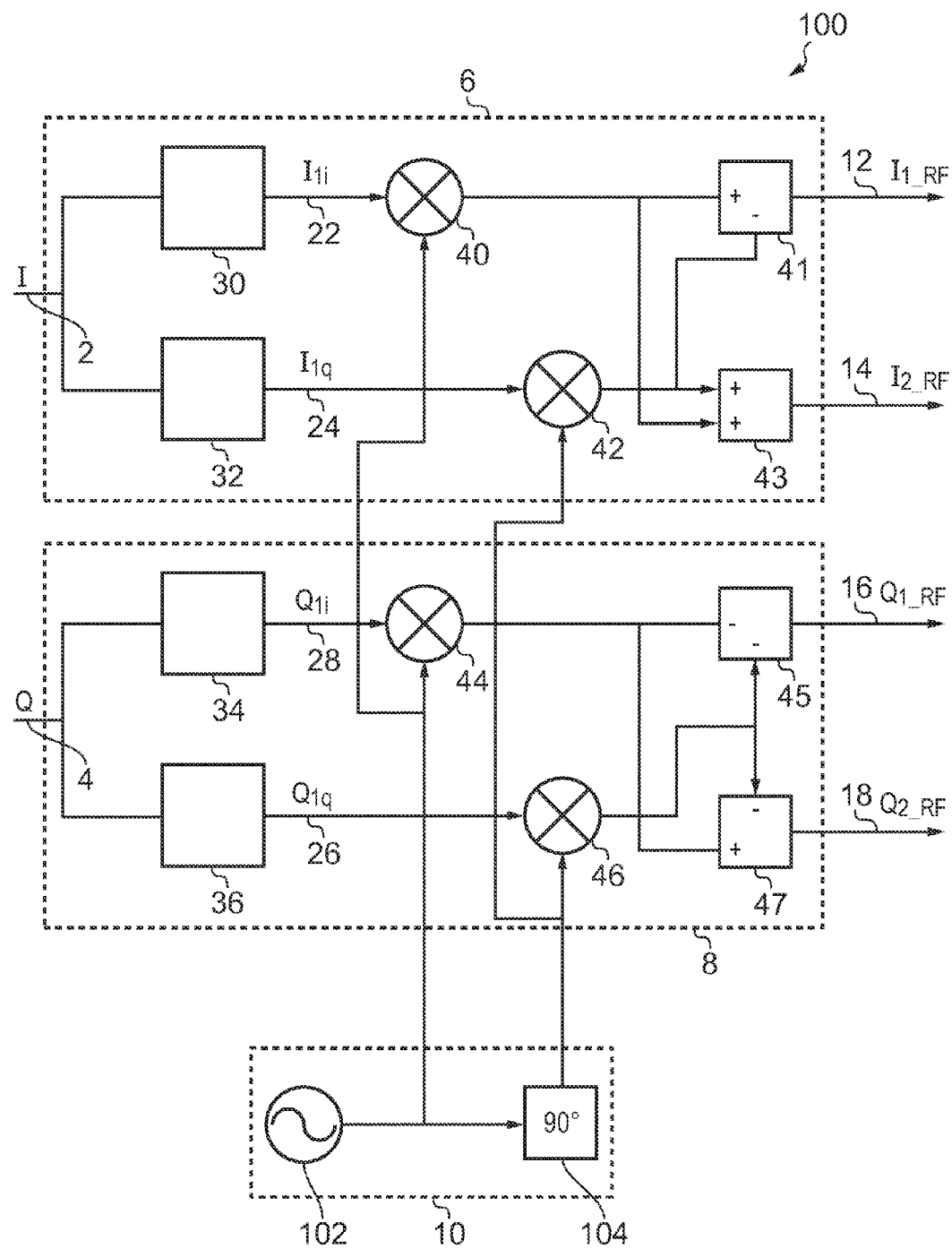
FIG. 2 is a schematic illustration (not to scale) showing the separation and complex mixer unit of FIG. 1 in greater detail.

FIG. 2 is a schematic illustration (not to scale) showing the first baseband component modifier 6, the second baseband component modifier 8 and the local oscillator 10, shown in FIG. 1, in greater detail. The first baseband component modifier 6, the second baseband component modifier 8 and the local oscillator 10 are collectively form a separation and complex mixer unit 100. The same reference numerals have been used to indicate the same features.

The first baseband component modifier 6 comprises a first function operator 30, a second function operator 32, a first signal multiplier 40, a second signal multiplier 42, a first signal adder/subtracter 41 and a second signal adder/subtracter 43.

The first function operator 30 receives the first baseband component I 2. The first function operator 30 generates a first decomposed baseband signal 22 from the first baseband component I 2 by using the following function:

$$I_{1i} = \frac{I(t)}{2} = A_{mi}\cos(\theta_{Mi})$$

where $A_{mi}$ is the amplitude 20 of the signal and $\theta_{Mi}$ 21 is the phase of the signal.

The first decomposed baseband signal $I_{1i}$ 22 is outputted from the first function operator 30 to the first signal multiplier 40.

The first signal multiplier 40 multiplies the inputted first decomposed baseband signal $I_{1i}$ 22 with a signal received from the local oscillator 10. This signal is outputted to the first signal adder/subtracter 41 and the second signal adder/subtracter 43.

The second function operator 32 receives the first baseband component I 2. The second function operator 32 generates a second decomposed baseband signal $I_{1q}$ 24 from the first baseband component I 2 by using the following function:

$$I_{1q} = A_{mi}\sqrt{1 - \frac{I(t)^2}{4A_{mi}^2}} = A_{mi}\sin(\theta_{Mi})$$

where $A_{mi}$ is the amplitude 20 of the signal and $\theta_{Mi}$ 21 is the phase of the signal.

The second decomposed baseband signal $I_{1q}$ 24 is outputted from the second function operator 32 to the second signal multiplier 42.

The second signal multiplier 42 multiplies the inputted second decomposed baseband signal $I_{1q}$ 24 with a signal received from the local oscillator 10. This signal is outputted to the first signal adder/subtracter 41 and the second signal adder/subtracter 43.

The first signal adder/subtracter 41 receives signals from the first signal multiplier 40 and the second signal multiplier 42. The first signal adder/subtracter 41 adds the signal from the first signal multiplier 40 and subtracts the signal from the second signal multiplier 42. The first signal adder/subtracter 41 generates the first constant envelope RF carrier $I_{1\_RF}$ 12, which is given by the following formula:

$$I_1 = A_{mi}\cos(\omega_c t + \theta_{Mi})$$

where $A_{mi}$ is the amplitude 20 of the signal and $\omega_c$ is the frequency of the (RF carrier) signal.

The second signal adder/subtracter 43 receives signals from the first signal multiplier 40 and the second signal multiplier 42. The second signal adder/subtracter 43 adds the signal from the first signal multiplier 40 and adds the signal from the second signal multiplier 42. The second signal adder/subtracter 43 generates the second constant envelope RF carrier $I_{2\_RF}$ 14, which is given by the following formula:

$$I_2 = A_{mi}\cos(\omega_c t - \theta_{Mi})$$

where $A_{mi}$ is the amplitude 20 of the signal and $\omega_c$ is the frequency of the (RF carrier) signal.

The second baseband component modifier 8 comprises a third function operator 34, a fourth function operator 36, a third signal multiplier 44, a fourth signal multiplier 46, a third signal adder/subtracter 45 and a fourth signal adder/subtracter 47.

The third function operator 34 receives the second baseband component Q 4. The third function operator 34 generates a third decomposed baseband signal $Q_{1i}$ 28 from the second baseband component Q 4 by using the following function:

$$Q_{1i} = A_{mq}\sqrt{1 - \frac{Q(t)^2}{4A_{mq}^2}} = A_{mq}\sin(\theta_{Mq})$$

where $A_{mq}$ is the amplitude 20 of the signal and $\theta_{Mq}$ 23 is the phase of the signal.

The third decomposed baseband signal $Q_{1i}$ 28 is outputted from the third function operator 34 to the third signal multiplier 44.

The third signal multiplier 44 multiplies the third decomposed baseband signal $Q_{1i}$ 28 with a signal received from the local oscillator 10. This signal is outputted to the third signal adder/subtracter 45 and the fourth signal adder/subtracter 47.

The fourth function operator 36 receives the second baseband component Q 4. The fourth function operator 36 generates a fourth decomposed baseband signal $Q_{1q}$ 26 from the second baseband component Q 4 by using the following function:

$$Q_{1q} = \frac{Q(t)}{2} = A_{mq}\cos(\theta_{Mq})$$

where $A_{mq}$ is the amplitude 20 of the signal and $\theta_{Mq}$ 23 is the phase of the signal.

The fourth decomposed baseband signal $Q_{1q}$ 26 is outputted from the fourth function operator 36 to the fourth signal multiplier 46.

The fourth signal multiplier 46 multiplies the inputted fourth decomposed baseband signal $Q_{1q}$ 26 with a signal received from the local oscillator 10. This signal is outputted to the third signal adder/subtracter 45 and the fourth signal adder/subtracter 47.

The third signal adder/subtracter 45 receives signals from the third signal multiplier 44 and the fourth signal multiplier 46. The third signal adder/subtracter 45 subtracts the signal from the third signal multiplier 44 and subtracts the signal from the fourth signal multiplier 46. The third signal adder/subtracter 45 generates the third constant envelope RF carrier $Q_{1\_RF}$ 16, which is given by the following formula:

$$Q_1 = -A_{mq}\sin(\omega_c t + \theta_{Mq})$$

where $A_{mq}$ is the amplitude 20 of the signal and $\omega_c$ is the frequency of the signal.

The fourth signal adder/subtracter 47 receives signals from the third signal multiplier 44 and the fourth signal multiplier 46. The fourth signal adder/subtracter 47 adds the signal from the third signal multiplier 44 and subtracts the signal from the fourth signal multiplier 46. The fourth signal adder/subtracter 47 generates the fourth constant envelope RF carrier $Q_{2\_RF}$ 18, which is given by the following formula:

$$Q_2 = -A_{mq}\sin(\omega_c t - \theta_{Mq})$$

where $A_{mq}$ is the amplitude 20 of the signal and $\omega_c$ is the frequency of the signal.

The first constant envelope RF carrier $I_{1\_RF}$ 12, the second constant envelope RF carrier $I_{2\_RF}$ 14, the third constant envelope RF carrier $Q_{1\_RF}$ 16, and the fourth constant envelope RF carrier $Q_{2\_RF}$ 18 are constant envelope phase modulated RF signals.

The local oscillator 10 comprises an oscillation generator 102 and a phase shifter 104. The oscillation generator 102 is connected to the first signal multiplier 40 and the third signal multiplier 44. The oscillation generator 102 is connected to the second signal multiplier 42 and the fourth signal multiplier 46 via the phase shifter 104. The phase shifter 104 shifts the signal from the oscillation generator by 90 degrees.

An advantage of generating the out-phasing signals $I_{1\_RF}$ 12, $I_{2\_RF}$ 14, $Q_{1\_RF}$ 16 and $Q_{2\_RF}$ 18 in this way is that they have less band-width than the signals generated by conventional methods. The out-phasing signals $I_{1\_RF}$ 12, $I_{2\_RF}$ 14, $Q_{1\_RF}$ 16 and $Q_{2\_RF}$ 18 have less band-width than conventionally generated signals as a result of spectrum extension being a function of the harmonics of the original I 2 and Q 4 baseband quadrature signals, in the present embodiment, and not a function of the phase modulation or envelope of the original signal s(t) 11, as in conventional methods.

Another advantage is that the matching requirements will be lower than in conventional systems because of the reduced bandwidth of the generated constant envelope signals 12, 14, 16, 18.

Another advantage is that for adjacent channels the Adjacent Channel Power Ratio (ACPR) requirements are more relaxed than those in conventional systems.

What will follow is an algebraic derivation of formulae that may be used for the generation of the constant envelope RF carrier signals $I_{1\_RF}$ 12, $I_{2\_RF}$ 14, $Q_{1\_RF}$ 16 and $Q_{2\_RF}$ 18.

The transmitted RF carrier (baseband) signal s 11 is given by:

$$s = Re\lfloor(\bar{s}_{base})e^{j\omega_c t}\rfloor = I\cos(\omega_c t) - Q\sin(\omega_c t)$$

where $\bar{s}_{base} = I + jQ$ is the complex baseband signal to be transmitted, I is the first baseband component 2, Q is the second baseband component 4 and $\omega_c$ is the frequency of the transmitted RF carrier (baseband) signal s 11.

The first baseband component I 2 and the second baseband component Q 4 can each be decomposed in to two constant envelope signals. The first baseband component I 2 can be decomposed into the two complex constant envelope signals $\bar{I}_1$ 60 and $\bar{I}_2$ 62 and the second baseband component Q 4 can be decomposed into the two complex constant envelope signals $\bar{Q}_1$ 64 and $\bar{Q}_2$ 66:

$$I = \bar{I}_1 + \bar{I}_2$$

$$Q = \bar{Q}_1 + \bar{Q}_2 \qquad (1)$$

The two complex constant envelope signals $\bar{I}_1$ 60 and $\bar{I}_2$ 62 are complex conjugate, thus the first baseband component I 2 is a real AM modulated signal. The two complex constant envelope signals $\bar{Q}_1$ 64 and $\bar{Q}_2$ 66 are complex conjugate, thus the second baseband component Q 4 is a real AM modulated signal.

Thus, replacing the I and Q terms in the equation for the complex baseband signal to be transmitted and the equation for the transmitted baseband signal s 11, above, with the terms for 1 and Q given in equation 27 yields the equations:

$$\bar{s}_{base} = (\bar{I}_1 + \bar{I}_2) + j(\bar{Q}_1 + \bar{Q}_2) \qquad (2)$$

And $$s = Re[s] = Re\lfloor((\bar{I}_1 + \bar{I}_2) + j(\bar{I}_1 + \bar{Q}_2))e^{j\omega_c t}\rfloor \qquad (3)$$

The real and imaginary parts $I_{1i}$ 22, $I_{1q}$ 24 of the complex constant baseband envelope signal $\bar{I}_1$ 60 and the real and imaginary parts $Q_{1i}$ 28 and $Q_{1q}$ 26 and of the complex constant baseband envelope signal $\overline{Q_1}$ 64 are given by:

$$I_{1i}=Re(\bar{I}_1)=Re(A_{mi}e^{j\theta_{Mi}})=+A_{mi}\cos(\theta_{Mi})$$

$$I_{1q}=Im(\bar{I}_1)=Im(A_{mi}e^{j\theta_{Mi}})=+A_{mi}\sin(\theta_{Mi})$$

$$Q_{1i}=Re(\overline{Q_1})=Re(A_{mq}e^{j\theta_{Mq}})=-A_{mq}\sin(\theta_{Mq})$$

$$Q_{1q}=Im(\overline{Q_1})=Im(A_{mq}e^{j\theta_{Mq}})=-A_{mq}\cos(\theta_{Mq}) \quad (4)$$

where $\theta_{Mi}$ 21 is the phase (subject to sign) of the constant baseband envelope signals $\bar{I}_1$ 60 and $\bar{I}_2$ 62, and $\theta_{Mq}$ 23 is the phase (subject to sign) of the constant baseband envelope signals $\overline{Q_1}$ 64 and $\overline{Q_2}$ 66.

Figure 3:
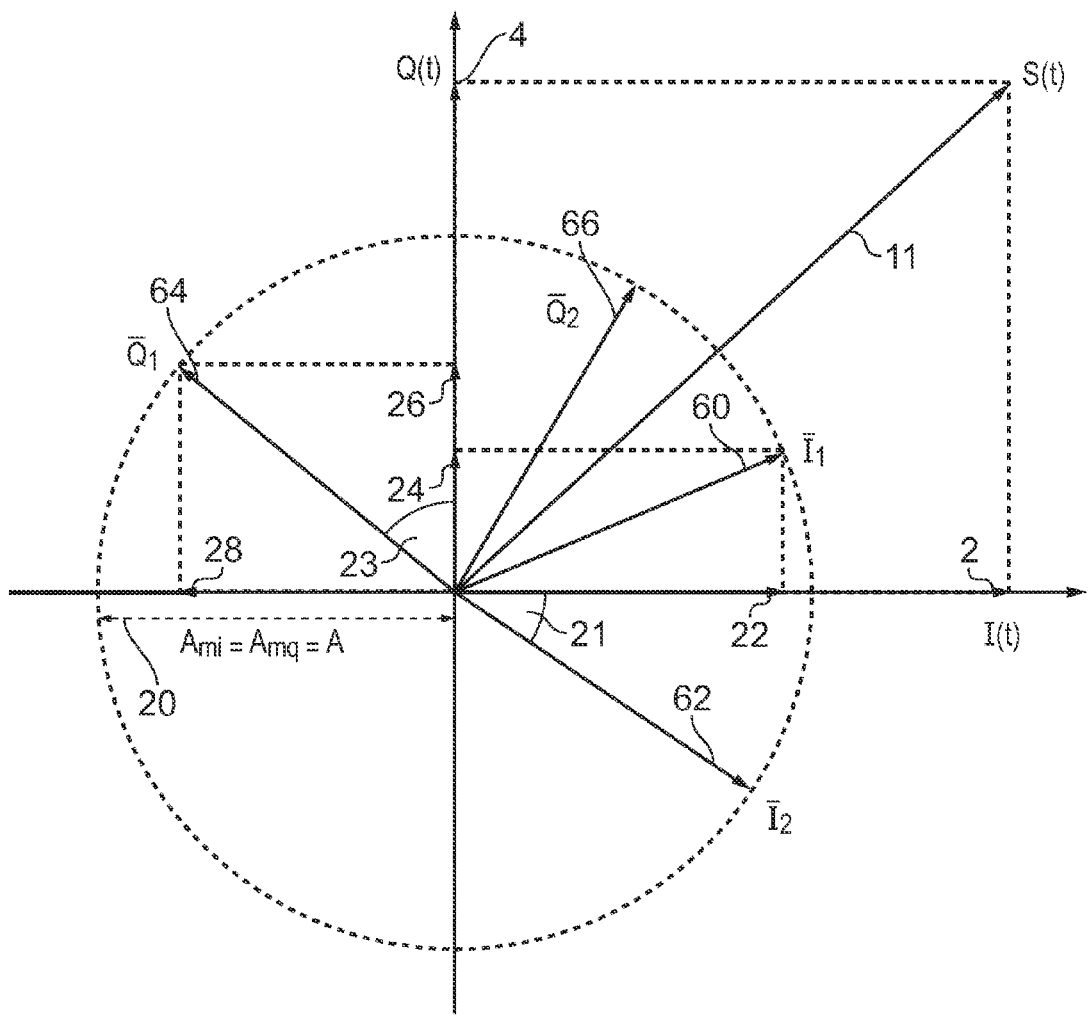
FIG. 3 is a schematic illustration showing the relationship between certain signals being processed.

FIG. 3 is a schematic diagram showing the relationships between the transmitted baseband signal s 11, the first baseband component I 2, the second baseband component Q 4, the complex constant baseband envelope signals $\bar{I}_1$ 60, $\bar{I}_2$ 62, $\overline{Q_1}$ 64 and $\overline{Q_2}$ 66, the real and imaginary parts $I_{1i}$ 22, $I_{1q}$ 24 of the complex constant baseband envelope signal $\bar{I}_1$ 60 and the real and imaginary parts $Q_{1i}$ 28 and $Q_{1q}$ 26 and of the complex constant baseband envelope signal $\overline{Q_1}$ 64. FIG. 3 also shows the phases $\theta_{Mi}$ 21 and $\theta_{Mq}$ 23.

Further shown in FIG. 3 is the amplitude A 20 of the first, second, third and fourth constant envelope RF carriers. The amplitude A 20 of the first, second, third and fourth constant envelope RF carriers are equal.

The relationships between the signals $I_{1i}$ 22, $I_{1q}$ 24, $Q_{1i}$ 28 and $Q_{1q}$ 26 and the real and imaginary components of the complex constant envelope signals $\bar{I}_2$ 62 and $\overline{Q_2}$ 66 are given by:

$$I_{1i}=I_{2i} \quad I_{1q}=-I_{2q}$$

$$Q_{1i}=-Q_{2i} \quad Q_{1q}=Q_{2q} \quad (5)$$

Also, the following equations hold:

$$\cos(\theta_{Mi}) = \frac{I}{2A_{mi}} \quad (6)$$

$$\sin(\theta_{Mi}) = \sqrt{1 - \frac{I^2}{4A_{mi}^2}}$$

$$\cos(\theta_{Mq}) = \frac{Q}{2A_{mq}}$$

$$\sin(\theta_{Mq}) = \sqrt{1 - \frac{Q^2}{4A_{mq}^2}}$$

The complex constant envelope signals $\bar{I}_1$ 60, $\bar{I}_2$ 62, $\overline{Q_1}$ 64 and $\overline{Q_2}$ 66 can be expressed as follows:

$$\bar{I}_{1\_RF}=(I_{1i}+jI_{1q})e^{j(\omega_c t)}$$

$$\bar{I}_{2\_RF}=(I_{2i}+jI_{2q})e^{j(\omega_c t)}$$

$$\overline{Q_1}_{\_RF}=(Q_{1i}+jQ_{1q})e^{j(\omega_c t)}$$

$$\overline{Q_2}_{\_RF}=(Q_{2i}+jQ_{2q})e^{j(\omega_c t)} \quad (7)$$

The equations of the generated constant envelope RF carrier signals $I_{1\_RF}$ 12, $I_{2\_RF}$ 14, $Q_{1\_RF}$ 16 and $Q_{2\_RF}$ 18 are:

$$I_{1\_RF}=Re(\bar{I}_{1\_RF})=I_{1i}\cos(\omega_c t)-I_{1q}\sin(\omega_c t)$$

$$I_{2\_RF}=Re(\bar{I}_{2\_RF})=I_{2i}\cos(\omega_c t)-I_{2q}\sin(\omega_c t)$$

$$Q_{1\_RF}=Re(\overline{Q_1}_{\_RF})=Q_{1i}\cos(\omega_c t)-Q_{1q}\sin(\omega_c t)$$

$$Q_{2\_RF}=Re(\overline{Q_2}_{\_RF})=Q_{2i}\cos(\omega_c t)-Q_{2q}\sin(\omega_c t) \quad (8)$$

Thus:

$$I_{1\_RF} = Re(\bar{I}_{1\_RF}) = \frac{I}{2}\cos(\omega_c t) - A_{mi}\sqrt{1-\frac{I^2}{4A_{mi}^2}}\sin(\omega_c t) \quad (9)$$

$$I_{2\_RF} = Re(\bar{I}_{2\_RF}) = \frac{I}{2}\cos(\omega_c t) + A_{mi}\sqrt{1-\frac{I^2}{4A_{mi}^2}}\sin(\omega_c t)$$

$$Q_{1\_RF} = Re(\overline{Q_1}_{\_RF}) = -A_{mq}\sqrt{1-\frac{Q^2}{4A_{mq}^2}}\cos(\omega_c t) - \frac{Q}{2}\sin(\omega_c t)$$

$$Q_{2\_RF} = Re(\overline{Q_2}_{\_RF}) = -A_{mq}\sqrt{1-\frac{Q^2}{4A_{mq}^2}}\cos(\omega_c t) + \frac{Q}{2}\sin(\omega_c t)$$

This can also be written as:

$$I_{1\_RF}=Re(\bar{I}_{1\_RF})=A_{mi}(+\cos(\omega_{Mi})\cos(\omega_c t)-\sin(\omega_{Mi})\sin(\omega_c t))$$

$$I_{2\_RF}=Re(\bar{I}_{2\_RF})=A_{mi}(+\cos(\omega_{Mi})\cos(\omega_c t)+\sin(\omega_{Mi})\sin(\omega_c t))$$

$$Q_{1\_RF}=Re(\overline{Q_1}_{\_RF})=A_{mq}(-\sin(\omega_{Mq})\cos(\omega_c t)-\cos(\omega_{Mq})\sin(\omega_c t))$$

$$Q_{2\_RF}=Re(\overline{Q_2}_{\_RF})=A_{mq}(+\sin(\omega_{Mq})\cos(\omega_c t)-\cos(\omega_{Mq})\sin(\omega_c t)) \quad (10)$$

Further simplification yields:

$$I_{1\_RF}=Re(\bar{I}_{1\_RF})=+A_{mi}\cos(\omega_c t+\theta_{Mi})$$

$$I_{2\_RF}=Re(\bar{I}_{2\_RF})=+A_{mi}\cos(\omega_c t-\theta_{Mi})$$

$$Q_{1\_RF}=Re(\overline{Q_1}_{\_RF})=-A_{mq}\sin(\omega_c t+\theta_{Mq})$$

$$Q_{2\_RF}=Re(\overline{Q_2}_{\_RF})=-A_{mq}\sin(\omega_c t-\theta_{Mq})$$

Thus, in this embodiment the above four constant envelope RF carrier signals shown in equation (11), i.e. $I_{1\_RF}$ 12, $I_{2\_RF}$ 14, $Q_{1\_RF}$ 16 and $Q_{2\_RF}$ 18, are provided. These four provided out-phasing signals $I_{1\_RF}$ 12, $I_{2\_RF}$ 14, $Q_{1\_RF}$ 16 and $Q_{2\_RF}$ 18 are new compared to signals provided in conventional approaches. As mentioned above the signals $I_{1\_RF}$ 12, $I_{2\_RF}$ 14, $Q_{1\_RF}$ 16 and $Q_{2\_RF}$ 18 use less bandwidth than those generated by conventional methods. A further advantage of the above mentioned signals $I_{1\_RF}$ 12, $I_{2\_RF}$ 14, $Q_{1\_RF}$ 16 and $Q_{2\_RF}$ 18 is that they are all constant envelope signals. This allows further implementations of the signals, as described later below.

It will be appreciated that in other embodiments different signal equations of signals $I_{1\_RF}$ 12, $I_{2\_RF}$ 14, $Q_{1\_RF}$ 16 and $Q_{2\_RF}$ 18 to those listed above may be implemented using the same principles as those described above.

Furthermore, in this embodiment the particular signals $I_{1\_RF}$ 12, $I_{2\_RF}$ 14, $Q_{1\_RF}$ 16 and $Q_{2\_RF}$ 18 are provided by the particular first, second, third and fourth function operators 30, 32, 34, 36 as described above. However, it will be appreciated that in other embodiments other appropriate function operators, for example pre-distortion, may be used instead.

Figure 4:
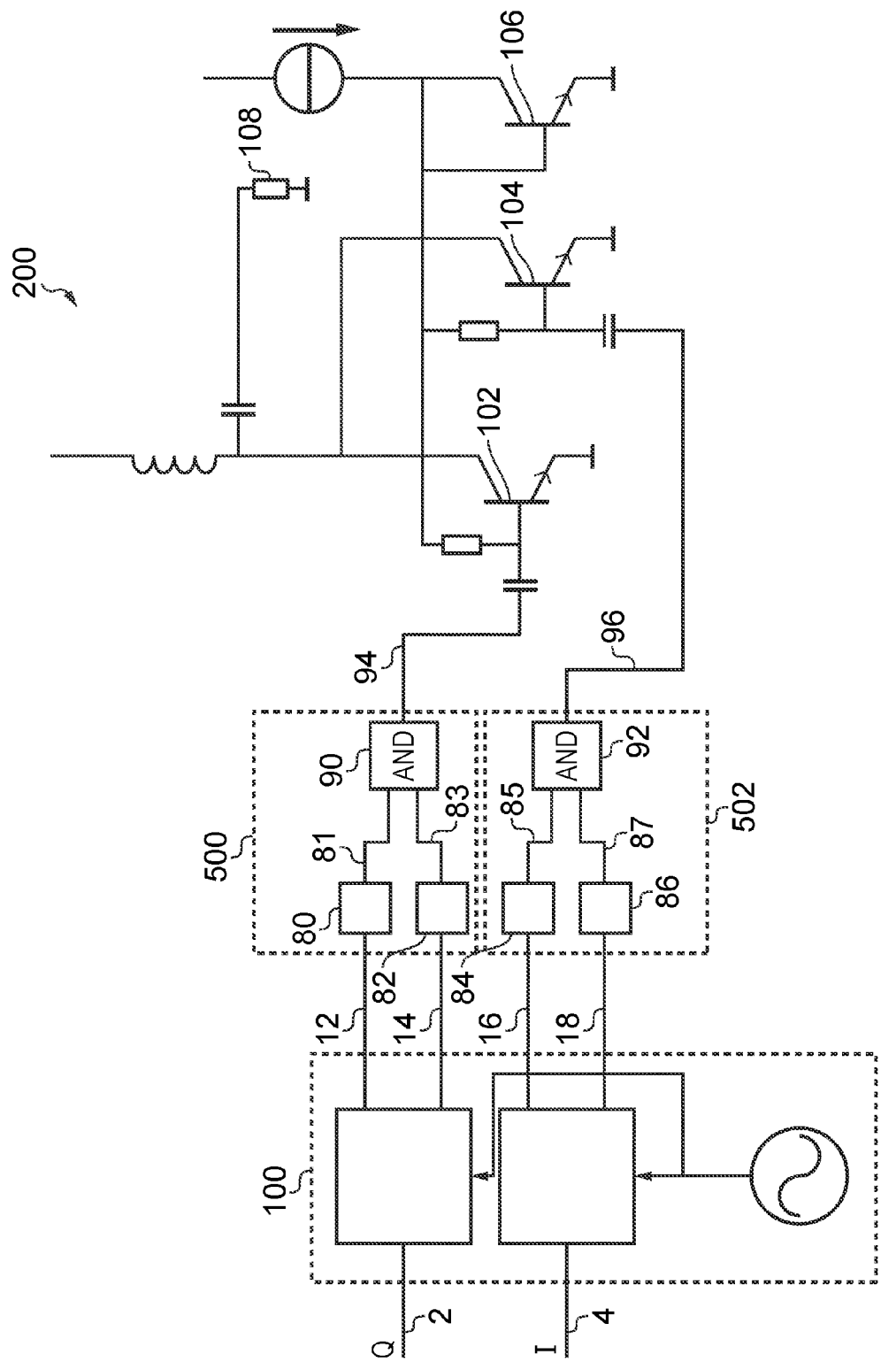
FIG. 4 is a schematic diagram of a quadrature-PWM amplifier.

FIG. 4 is a schematic diagram (not to scale) of an embodiment of a quadrature-PWM amplifier 200 that uses the generated constant envelope RF carrier signals $I_{1\_RF}$ 12, $I_{2\_RF}$ 14, $Q_{1\_RF}$ 16 and $Q_{2\_RF}$ 18 and pulse width modulation (PWM).

The quadrature-PWM amplifier 200 comprises a separation and complex mixer unit 100 of the same type, as described in FIG. 2, a first limiter 80, a second limiter 82, a third limiter 84, a fourth limiter 86, a first AND gate 90, a second AND gate 92, a first transistor 102, a second transistor 104, a third transistor 106 and an output load 108.

The first limiter 80, the second limiter 82 and the first AND gate 90 together may be considered as providing a first signal combiner 500.

The third limiter 84, the fourth limiter 86 and the second AND gate 92 together may be considered as providing a second signal combiner 502.

The separation and complex mixer unit 100 receives the first baseband component I 2 and the second baseband component Q 4. The separation and complex mixer unit 100 outputs the constant envelope RF carrier signals $I_{1\_RF}$ 12, $I_{2\_RF}$ 14, $Q_{1\_RF}$ 16 and $Q_{2\_RF}$ 18.

The first limiter 80 is inputted with the first constant envelope RF carrier signal $I_{1\_RF}$ 12. The first limiter 80 limits the first constant envelope RF carrier signal $I_{1\_RF}$ 12 and outputs the limited first constant envelope RF carrier $I_{1L}$ 81.

The second limiter 82 is inputted with the second constant envelope RF carrier signal $I_{2\_RF}$ 14. The second limiter 82 limits the second constant envelope RF carrier signal $I_{2\_RF}$ 14 and outputs the limited second constant envelope RF carrier $I_{2L}$ 83.

The third limiter 84 is inputted with the third constant envelope RF carrier signal $Q_{1\_RF}$ 16. The third limiter 84 limits the third constant envelope RF carrier signal $Q_1$ 16 and outputs the limited third constant envelope RF carrier $Q_{1L}$ 85.

The fourth limiter 86 is inputted with the fourth constant envelope RF carrier signal $Q_{2\_RF}$ 18. The fourth limiter 86 limits the fourth constant envelope RF carrier signal $Q_{2\_RF}$ 18 and outputs the limited fourth constant envelope RF carrier $Q_{2L}$ 87.

The first AND gate 90 receives as inputs the limited first constant envelope RF carrier $I_{1L}$ 81 and the limited second constant envelope RF carrier $I_{2L}$ 83. The first AND gate 90 outputs a first RF PWM signal $pwm_i$ 94.

The second AND gate 92 receives as inputs the limited third constant envelope RF carrier $Q_{1L}$ 85 and the limited fourth constant envelope RF carrier $Q_{2L}$ 87. The second AND gate 92 outputs a second RF PWM signal $pwm_q$ 96.

The first RF PWM signal $pwm_i$ 94 is transmitted to the base of the first transistor 102. The first RF PWM signal $pwm_i$ 94 operates the first transistor 102.

The second RF PWM signal $pwm_q$ 96 is transmitted to the base of the second transistor 104. The second RF PWM signal $pwm_q$ 96 operates the second transistor 104.

The output load 108 is driven by the resulting current 110 from the first and second transistors 102, 104. The resulting current 110 is the sum of the currents from the first and second transistors 102, 104.

The third transistor 106 provides biasing for the first and second transistors 102, 104.

An advantage of exploiting the quadrature-PWM concept as outlined in the quadrature-PWM amplifier 200 of FIG. 4 is that the quadrature signal decomposition method results only in a small increase of the bandwidth of the baseband and RF signals. This results in lower sample frequencies and less out of band matching requirements which is a disadvantage of the conventional LINC concepts.

A further advantage of the quadrature-PWM concept is that the generated PWM signals $pwm_i$ 94 and $pwm_q$ 96 have a small transmission bandwidth with respect to the earlier PWM-PPM concepts.

A further advantage of the quadrature-PWM concept is that when no power in the I 2 or Q 4 branch is needed the current is switched off. This results in an efficiency improvement in comparison with the switched LINC concept where two signals need to be generated in opposite phase to create zero output power.

Figure 5:
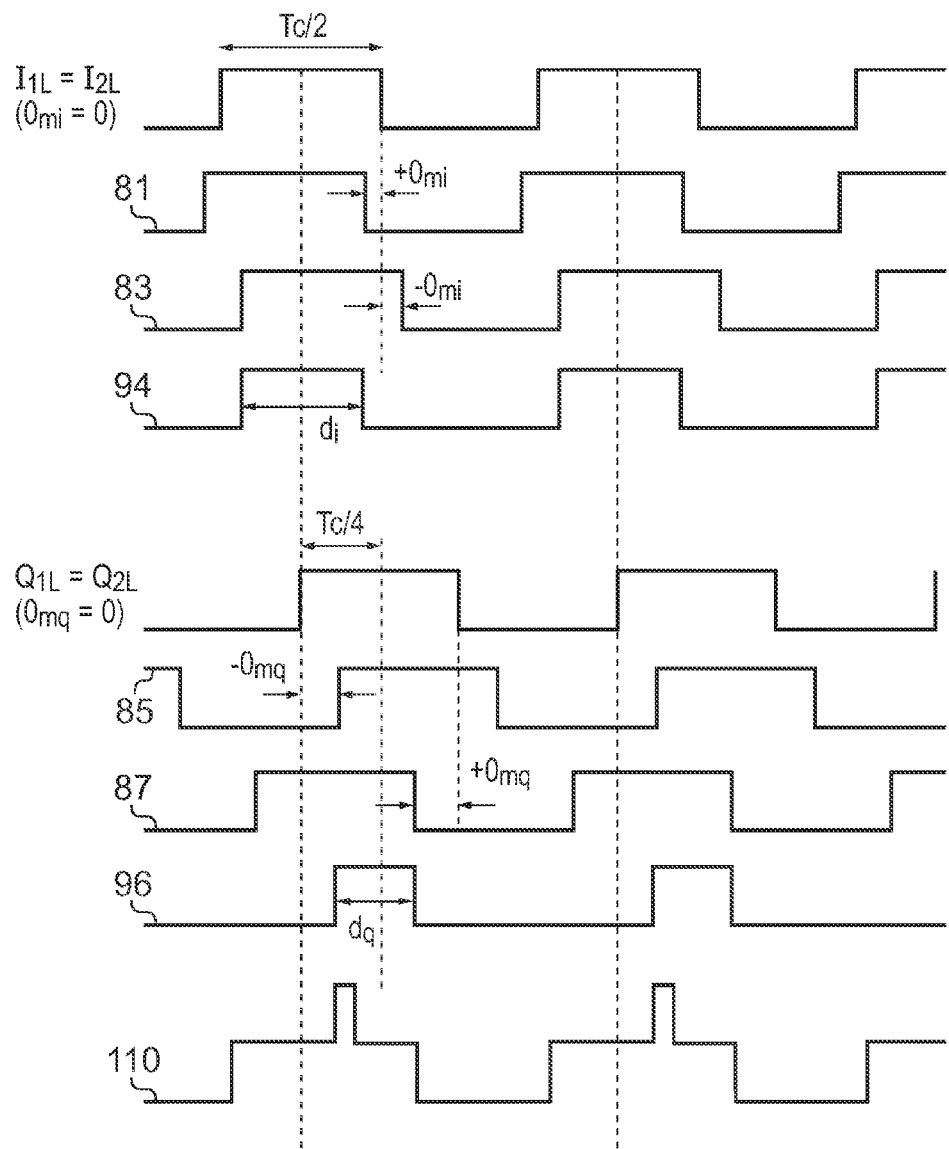
FIG. 5 is a schematic illustration of signal waveforms that result from the quadrature-PWM amplifier of FIG. 4.

FIG. 5 is a schematic illustration (not to scale) of signal waveforms that result from the quadrature-PWM amplifier 200 of FIG. 4. FIG. 5 shows waveforms of the limited first constant envelope RF carrier $I_{1L}$ 81, the limited second constant envelope RF carrier $I_{2L}$ 83, the limited third constant envelope RF carrier $Q_{1L}$ 85, the limited fourth constant envelope RF carrier $Q_{2L}$ 87, the first RF PWM signal $pwm_i$ 94, the second RF PWM signal $pwm_q$ 96 and the resulting current 110. The I signal is on the real positive axis ($pwm_i$) and the Q signal ($pwm_q$) on the positive imaginary (90 degrees rotated) axis. Thus, the vector position is in the first quadrant.

In the above embodiment the phase shifter 104 shifts the signal from the oscillation generator by 90 degrees. However, in other embodiments the phase shifter 104 shifts the signal from the oscillation generator by a different amount.

In the above embodiment the quadrature-PWM amplifier 200 comprises a first AND gate 90 and a second AND gate 92. However, in other embodiments other suitable gates can be used, for example NOR gates.

In the above embodiment the quadrature-PWM amplifier 200 uses only PWM for RF signals. However, in other embodiments the use of PWM for RF signals may be extended with the LINC principle.

Figure 6:
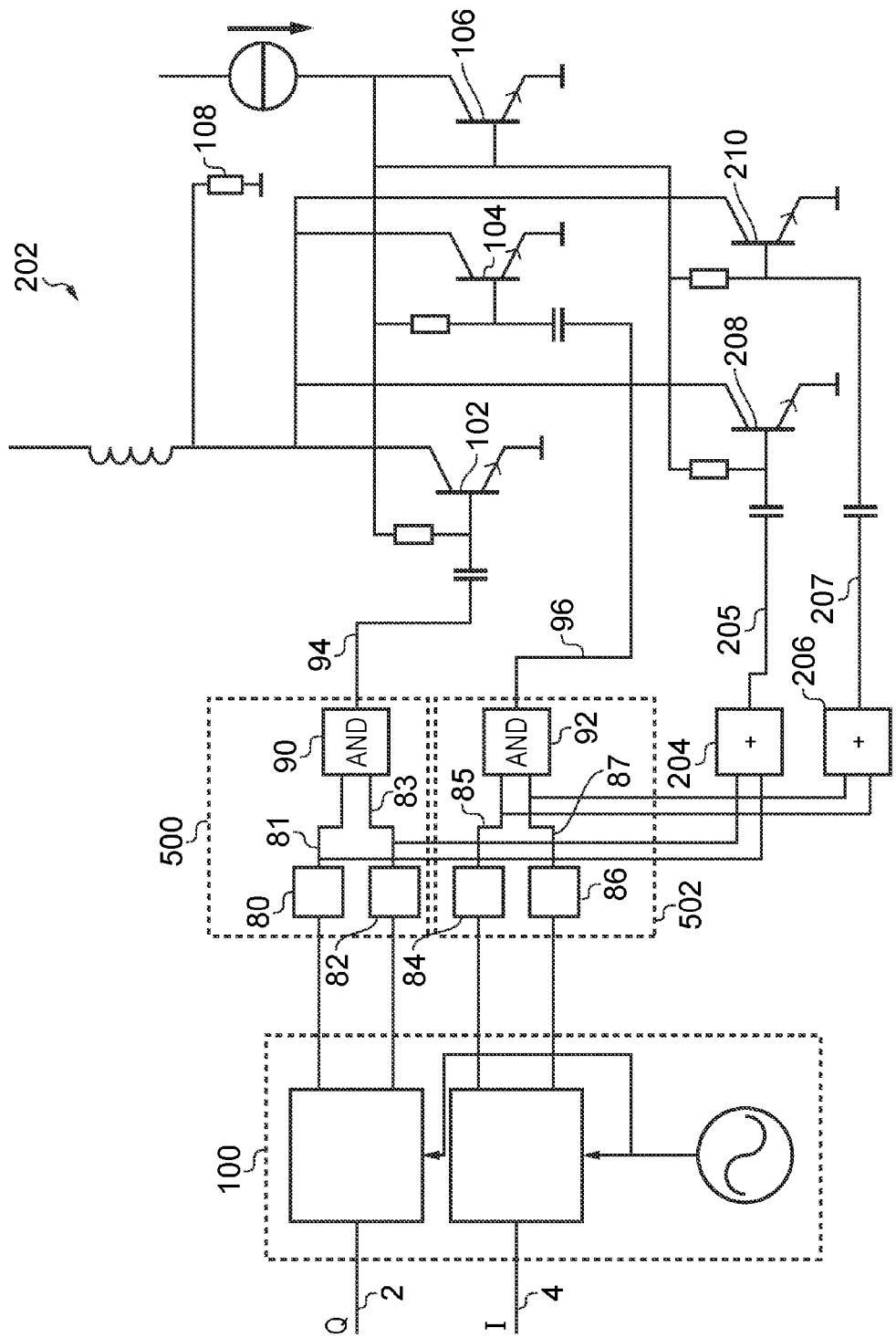
FIG. 6 is a schematic diagram of a hybrid PWM-LING amplifier.

FIG. 6 is a schematic diagram (not to scale) of an embodiment of a "hybrid" PWM-extended linear amplifier 202 using this principle. The same reference numerals have been used to indicate the same elements. In addition to those features described above for the quadrature-PWM amplifier 200 of FIG. 4, the "hybrid" PWM-extended linear amplifier 202 of FIG. 6 further comprises a first signal adding unit 204, a second signal adding unit 206, a fourth transistor 208, and a fifth transistor 210.

In this embodiment the first adding unit 204 receives the inputs of the limited first constant envelope RF carrier $I_{1L}$ 81, the limited second constant envelope RF carrier $I_q$ 83. The first adding unit 204 outputs a first RF LINC signal $S_1$ 205. The second adding unit 206 receives the inputs of the limited third constant envelope RF carrier $Q_{1L}$ 85 and the limited fourth constant envelope RF carrier $Q_{2L}$ 87. The second adding unit 206 outputs a second RF LINC signal $S_2$ 207. The first and second RF LINC signals 205, 207 operate the fourth and fifth transistors 208, 210 respectively. Signal 205 is a tristate signal which represents the RF carrier modulated with the I information signal of the original baseband signal. The transistor 208 operates in a linear mode on a low power level. Signal 207 is a tristate signal which represents the RF carrier modulated with the Q information signal of the original baseband signal. The transistor 210 operates in a linear mode on a low power level.

In this embodiment the output load 108 is driven by the resulting current 110 from the first, second, fourth and fifth transistors 102, 104, 208, 210. The resulting current 110 is the sum of the currents from the first, second, fourth and fifth transistors 102, 104, 208, 210.

An advantage of use of extending the quadrature-PWM concept with the LINC principle, for example using the "hybrid" PWM-extended linear amplifier 202 is that the system can process narrow pulses. The current sources for the LINC are small and in the case of too narrow PWM pulses, the LINC part of the system will still work, even if the PWM part of the system doesn't. This has the effect of increasing the efficiency of the system as there is no need for two switched current sources.

It will be appreciated in the above embodiments that the provided system will have significantly improved bandwidth characteristics of the baseband and RF signals. Also, in addition to the advantages outlined above, embodiments of the present invention may be used to provide means for providing efficient modulated transmitters for WLAN, WPAN, Blue-Tooth, OFDM, GSM, UMTS, CDMA, and low-power mobile communication devices.

The invention claimed is:

1. A quadrature out-phasing system comprising:
    a first baseband signal modifier arranged to receive a first baseband signal component and output a first constant envelope RF carrier and a second constant envelope RF carrier;
    a second baseband signal modifier arranged to receive a second baseband signal component and output a third constant envelope RF carrier and a fourth constant envelope RF carrier;
    a first signal combiner arranged to combine the first constant envelope RF carrier and the second constant envelope RF carrier, and arranged to output a first RF PWM signal; and
    a second signal combiner arranged to combine the third constant envelope RF carrier and the fourth constant envelope RF carrier, and arranged to output a second RF PWM signal.

2. The system according to claim 1, further comprising a local oscillator connected to the first baseband signal modifier and the second baseband signal modifier.

3. The system according to claim 1 wherein:
    the first baseband signal modifier is arranged to decompose the first baseband signal component into a first decomposed baseband signal and a second decomposed baseband signal; and
    the second baseband signal modifier is arranged to decompose the second baseband signal component into a third decomposed baseband signal and a fourth decomposed baseband signal.

4. The system according to claim 3, wherein:
    the first baseband signal modifier is arranged to up convert to RF frequency and then combine the first decomposed baseband signal and the second decomposed baseband signal to form the first constant envelope RF carrier and the second constant envelope RF carrier; and
    the second baseband signal modifier is arranged to up convert to RF frequency and then combine the third decomposed baseband signal and the fourth decomposed baseband signal to form the third constant envelope RF carrier and the fourth constant envelope RF carrier.

5. The system according to claim 1 wherein the first constant envelope RF carrier, the second constant envelope RF carrier, the third constant envelope RF carrier and the fourth constant envelope RF carrier, are determined using the following formulae:

$$I_{1\_RF} = Re(\tilde{I}_{1\_RF}) = +A_{mi} \cos(\omega_c t + \theta_{Mi})$$

$$I_{2\_RF} = Re(\tilde{I}_{2\_RF}) = +A_{mi} \cos(\omega_c t - \theta_{Mi})$$

$$Q_{1\_RF} = Re(\overline{Q}_{1\_RF}) = -A_{mq} \sin(\omega_c t + \theta_{Mq})$$

$$Q_{2\_RF} = Re(\overline{Q}_{2\_RF}) = -A_{mq} \sin(\omega_c t - \theta_{Mq})$$

where:
    $I_{1\_RF}$ is the first constant envelope RF carrier;
    $I_{2\_RF}$ is the second constant envelope RF carrier;
    $Q_{1\_RF}$ is the third constant envelope RF carrier;
    $Q_{2\_RF}$ is the fourth constant envelope RF carrier;
    $A_{mi}$ is an amplitude of a complex constant envelope signal $I_1$ (or $I_2$);
    $A_{mq}$ is an amplitude of a complex constant envelope signal $Q_1$ (or $Q_2$);
    $\theta_{Mi}$ is a phase of a complex constant envelope signal $I_2$ derived from an original I component of the complex baseband signal;
    $\theta_{Mq}$ is a phase of a complex constant envelope signal $Q_1$ derived from an original Q component of the complex baseband signal; and
    $\omega_c$ is a frequency of an RF carrier signal.

6. The system according to claim 3 wherein the first decomposed baseband signal, the second decomposed baseband signal, the third decomposed baseband signal and the fourth decomposed baseband signal, are determined using the following formulae:

$$I_{1i} = \frac{I(t)}{2} = A_{mi}\cos(\theta_{Mi})$$

$$I_{1q} = A_{mi}\sqrt{1 - \frac{I(t)^2}{4A_{mi}^2}} = A_{mi}\sin(\theta_{Mi})$$

$$Q_{1i} = A_{mq}\sqrt{1 - \frac{Q(t)^2}{4A_{mq}^2}} = A_{mq}\sin(\theta_{Mq})$$

$$Q_{1q} = \frac{Q(t)}{2} = A_{mq}\cos(\theta_{Mq})$$

Where:
    $I_{1i}$ is the first decomposed baseband signal;
    $I_{1q}$ is the second decomposed baseband signal;
    $Q_{1i}$ is the third decomposed baseband signal;
    $Q_{1q}$ is the fourth decomposed baseband signal;
    I(t) is the first baseband signal component;
    Q(t) is the second baseband signal component;
    $A_{mi}$ is an amplitude of a complex constant envelope signal $I_1$ (or $I_2$);
    $A_{mq}$ is an amplitude of a complex constant envelope signal $Q_1$ (or $Q_2$);
    $\theta_{Mi}$ is a phase of the complex constant envelope signal $I_2$ derived from an original I component of a complex baseband signal; and
    $\theta_{Mq}$ is a phase of the complex constant envelope signal $Q_1$ derived from an original Q component of the complex baseband signal.

7. The system according to claim 1 wherein: the first signal combiner comprises:
    a first limiter arranged to receive the first constant envelope RF carrier signal and output a limited first constant envelope RF carrier;
    a second limiter arranged to receive the second constant envelope RF carrier signal and outputs a limited second constant envelope RF carrier; and
    a first AND gate arranged to receive the limited first constant envelope RF carrier signal and the limited second constant envelope RF carrier signal, and to output the first RF PWM signal; and
the second signal combiner comprises:
    a third limiter arranged to receive the third constant envelope RF carrier signal and output a limited third constant envelope RF carrier;
    a fourth limiter arranged to receive the fourth constant envelope RF carrier signal and outputs a limited fourth constant envelope RF carrier; and a second AND gate arranged to receive the limited third constant envelope RF carrier signal and the limited fourth constant envelope RF carrier signal, and to output the second RF PWM signal.

8. A method of generating a first RF PWM signal, a second RF PWM signal, a first constant envelope RF carrier, a second constant envelope RF carrier, a third constant envelope RF carrier and a fourth constant envelope RF carrier, the method comprising the steps of:
receiving a first baseband signal component and modifying the first baseband signal component to form the first constant envelope RF carrier and the second constant envelope RF carrier;
receiving a second baseband signal component and modifying the second baseband signal component to form the third constant envelope RF carrier and the fourth constant envelope RF carrier;
combining the first constant envelope RF carrier and the second constant envelope RF carrier, to output a first RF PWM signal; and
combining the third constant envelope RF carrier and the fourth constant envelope RF carrier, to output a second RF PWM signal.

9. The method according to claims 8, further comprising the steps of:
decomposing the first baseband signal component into a first decomposed baseband signal and a second decomposed baseband signal; and
decomposing the second baseband signal component into a third decomposed baseband signal and a fourth decomposed baseband signal.

10. The method according to claim 9, further comprising the steps of:
up converting to RF frequency and then combining the first decomposed baseband signal and the second decomposed baseband signal to form the first constant envelope RF carrier and the second constant envelope RF carrier; and
up converting to RF frequency and then combining the third decomposed baseband signal and the fourth decomposed baseband signal to form the third constant envelope RF carrier and the fourth constant envelope RF carrier.

11. The method according to claim 8, wherein the first constant envelope RF carrier, the second constant envelope RF carrier, the third constant envelope RF carrier and the fourth constant envelope RF carrier, are determined using the following formulae:

$$I_{1\_RF} = Re(\bar{I}_{1\_RF}) = +A_{mi}\cos(\omega_c t + \theta_{Mi})$$

$$I_{2\_RF} = Re(\bar{I}_{2\_RF}) = +A_{mi}\cos(\omega_c t - \theta_{Mi})$$

$$Q_{1\_RF} = Re(\overline{Q_{1\_RF}}) = -A_{mq}\sin(\omega_c t + \theta_{Mq})$$

$$Q_{2\_RF} = Re(\overline{Q_{2\_RF}}) = -A_{mq}\sin(\omega_c t - \theta_{Mq})$$

where:
$I_{1\_RF}$ is the first constant envelope RF carrier;
$I_{2\_RF}$ is the second constant envelope RF carrier;
$Q_{1\_RF}$ is the third constant envelope RF carrier;
$Q_{2\_RF}$ is the fourth constant envelope RF carrier;
$A_{mi}$ is an amplitude of a complex constant envelope signal $I_1$ (or $I_2$);
$A_{mq}$ is an amplitude of a complex constant envelope signal $Q_1$ (or $Q_2$);
$\theta_{Mi}$ is a phase of a complex constant envelope signal $I_2$ derived from an original I component of the complex baseband signal;
$\theta_{Mq}$ is a phase of a complex constant envelope signal $Q_1$ derived from an original Q component of the complex baseband signal; and
$\omega_c$ is a frequency of an RF carrier signal.

12. The method according to claim 9 wherein the first decomposed baseband signal, the second decomposed baseband signal, the third decomposed baseband signal and the fourth decomposed baseband signal, are determined using the following formulae:

$$I_{1i} = \frac{I(t)}{2} = A_{mi}\cos(\theta_{Mi})$$

$$I_{1q} = A_{mi}\sqrt{1 - \frac{I(t)^2}{4A_{mi}^2}} = A_{mi}\sin(\theta_{Mi})$$

$$Q_{1i} = A_{mq}\sqrt{1 - \frac{Q(t)^2}{4A_{mq}^2}} = A_{mq}\sin(\theta_{Mq})$$

$$Q_{1q} = \frac{Q(t)}{2} = A_{mq}\cos(\theta_{Mq})$$

Where:
$I_{1i}$ is the first decomposed baseband signal;
$I_{1q}$ is the second decomposed baseband signal;
$Q_{1i}$ is the third decomposed baseband signal;
$Q_{1q}$ is the fourth decomposed baseband signal;
$I(t)$ is the first baseband signal component;
$Q(t)$ is the second baseband signal component;
$A_{mi}$ is an amplitude of a complex constant envelope signal $I_1$ (or $I_2$);
$A_{mq}$ is an amplitude of a complex constant envelope signal $Q_1$ (or $Q_2$);
$\theta_{Mi}$ is a phase of the complex constant envelope signal $I_2$ derived from the original I component of the complex baseband signal; and
$\theta_{Mq}$ is a phase of the complex constant envelope signal $Q_1$ derived from the original Q component of the complex baseband signal.

* * * * *